(12) United States Patent
Shimizu et al.

(10) Patent No.: US 7,871,532 B2
(45) Date of Patent: Jan. 18, 2011

(54) PLASMA PROCESSING METHOD AND POST-PROCESSING METHOD

(75) Inventors: Akitaka Shimizu, Nirasaki (JP); Kosuke Ogasawara, Nirasaki (JP); Susumu Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 49 days.

(21) Appl. No.: 11/354,836

(22) Filed: Feb. 16, 2006

(65) Prior Publication Data

US 2006/0191877 A1     Aug. 31, 2006

Related U.S. Application Data

(60) Provisional application No. 60/722,967, filed on Oct. 4, 2005, provisional application No. 60/662,363, filed on Mar. 17, 2005.

(30) Foreign Application Priority Data

Feb. 28, 2005   (JP)   ............................. 2005-054119
Sep. 9, 2005    (JP)   ............................. 2005-262446

(51) Int. Cl.
*B23K 9/02*   (2006.01)
(52) U.S. Cl. ...................................................... 216/67
(58) Field of Classification Search ............ 219/121.43; 216/58, 107, 67; 156/345.34; 118/273 R
See application file for complete search history.

(56) References Cited

U.S. PATENT DOCUMENTS

| | | | |
|---|---|---|---|
| 6,802,944 B2 * | 10/2004 | Ahmad et al. | 204/192.23 |
| 6,872,322 B1 * | 3/2005 | Chow et al. | 216/67 |
| 6,908,862 B2 * | 6/2005 | Li et al. | 438/700 |
| 2002/0072016 A1 * | 6/2002 | Chen et al. | 430/323 |
| 2003/0129106 A1 * | 7/2003 | Sorensen et al. | 422/186.05 |
| 2004/0043612 A1 * | 3/2004 | Jung | 438/689 |

FOREIGN PATENT DOCUMENTS

JP    62-005532    1/1987
WO   WO/99/52126   * 10/1999

* cited by examiner

*Primary Examiner*—Michael Cleveland
*Assistant Examiner*—Tabassom Tadayyon Eslami
(74) *Attorney, Agent, or Firm*—Oblon, Spivak, McClelland, Maier & Neustadt, L.L.P.

(57) ABSTRACT

A plasma processing method for performing a plasma process on a target object placed in a chamber includes a first plasma process of turning a gas containing at least a halogen element into plasma to generate first plasma, thereby processing the target object; a second plasma process, subsequent to the first plasma process, of supplying a gas containing oxygen into the chamber to generate second plasma, thereby processing the chamber and the target object; and a third plasma process, subsequent to the second plasma process, of turning a gas containing at least fluorine into plasma to generate third plasma, thereby processing the target object.

12 Claims, 9 Drawing Sheets

PLASMA PROCESSING METHOD AND POST-PROCESSING METHOD

BACKGROUND OF THE INVENTION

1. Field of the Invention

The present invention relates to a plasma processing method and post-processing method, and more specifically to a plasma processing method and post-processing method for performing an etching process or the like on, e.g., a semiconductor wafer.

2. Description of the Related Art

Where a dry etching process using a corrosive gas, such as hydrogen bromide or chlorine, is performed on a substrate, such as a semiconductor wafer, it is necessary to take countermeasures against particle generation due to peel-off of reaction products deposited inside the process chamber, and deterioration of the process chamber due to the corrosive gas. Accordingly, it has been proposed to perform cleaning with $O_2$ plasma after dry etching in the Japanese Patent Publication (KOKAI) No. 63-5532. This $O_2$ plasma cleaning has the effects of replacing a halogen atmosphere within the chamber and preventing the chamber from being corroded, and may further have the effect of sputtering and removing a corrosive gas adsorbed on the substrate.

However, deposits of reaction products are present on the substrate after the etching process, and, for example, in the case of etching of a silicon substrate, deposits of reaction products comprise, e.g., $SiBr_4$ or $SiCl_4$. Such deposits cannot be completely removed by the cleaning process with $O_2$ plasma.

As described above, deposits on a substrate cannot be completely removed by the cleaning process with $O_2$ plasma. The deposits described above remaining on the substrate are predisposed to generate a corrosive gas, such as a halogen gas, when placed at a position open to atmosphere pressure. Accordingly, when the substrate is transferred to a subsequent process by a transfer system, a corrosive gas may be generated from the deposits on the substrate and corrode the transfer system. In general, as regards chambers for performing a process of e.g., etching using a corrosive gas, the inner surface thereof is made of aluminum or alumite, which can be a preliminary corrosion countermeasure. However, transfer systems are not designed to be in contact with a corrosive gas, and thus can be easily corroded. If transfer systems are deteriorated due to corrosion, particle contamination may be caused, and the systems may significantly reduce the durability as a whole. However, so far, corrosion countermeasures have been barely studied for transfer systems.

BRIEF SUMMARY OF THE INVENTION

The present invention was made in light such circumstances. An object of the present invention is to provide a plasma processing method and post-processing method, which can reliably prevent corrosion of the transfer system as well as the interior of the process chamber.

In order to solve the problems described above, according to a first aspect of the present invention, there is provided a plasma processing method for performing a plasma process on a target object placed in a chamber, the method comprising:

a first plasma process of turning a gas containing a halogen element into plasma to generate first plasma, thereby processing the target object;

a second plasma process, subsequent to the first plasma process, of supplying a gas containing oxygen into the chamber to generate second plasma, thereby processing the chamber and the target object; and a third plasma process, subsequent to the second plasma process, of turning a gas containing fluorine into plasma to generate third plasma, thereby processing the target object.

According to this plasma processing method, by performing the second plasma process and the third plasma process, it is possible to prevent the transfer system as well as the interior of the process chamber from being corroded by a halogen.

In the plasma processing method according to the first aspect, the first plasma process to the third plasma process may be performed within the same chamber. In this case, cleaning of the chamber and removal of a deposit from the target object surface are performed by an all-in-one process within a single chamber.

Alternatively, the first plasma process and the second plasma process may be performed within the same chamber, and the third plasma process is performed within a different chamber. In this case, since the target object is transferred to the different chamber, the influence of a halogen atmosphere within the chamber used for the first plasma process can be essentially cut off. Consequently, a corrosive gas is reliably prevented from being generated on the transfer system.

The second plasma process may be arranged to remove the gas containing a halogen element sticking to an inner wall of the chamber, a component inside the chamber, and the target object.

The third plasma process may be arranged to remove a halogenated compound, particularly a halogenated silicon, sticking to the target object.

The gas containing fluorine may be $CF_4$, $NF_3$, or $SF_6$, or may be a mixture gas of $CF_4$, $NF_3$, or $SF_6$ with $O_2$. In this case, the third plasma process is arranged to use the action of F radicals contained in fluorine gas plasma to remove a particle, such as an incrustation consists of a halogenated silicon or the like, sticking to the target object. Consequently, a halogen is prevented from being generated on the transfer system.

The halogen element may be chlorine or bromine, and the first plasma process may be a plasma etching process of silicon. In this case, the plasma etching process of silicon may be a silicon trench etching process for providing shallow trench isolation.

According to a second aspect of the present invention, there is provided a plasma processing method for performing a plasma process on a target object placed in a chamber, the method comprising:

a first plasma process of turning a gas containing a halogen element into plasma to generate first plasma, thereby performing an etching process on silicon;

a second plasma process, subsequent to the first plasma process, of supplying a gas containing oxygen into the chamber to generate second plasma, thereby removing the gas containing a halogen element sticking to an inner wall of the chamber, a component inside the chamber, and the target object; and a third plasma process, subsequent to the second plasma process, of turning a gas containing $CF_4$, $NF_3$, or $SF_6$ into plasma to generate third plasma, thereby removing a halogenated silicon sticking to the target object.

According to a third aspect of the present invention, there is provided a post-processing method to be performed after a process using a corrosive gas is performed on a target object placed in a chamber, the method comprising:

an $O_2$ plasma process of supplying a gas containing oxygen into the chamber to generate $O_2$ plasma, thereby processing the chamber and the target object; and a fluorine-containing gas plasma process, subsequent to the $O_2$ plasma process, of turning a gas containing fluorine into plasma to generate fluorine-containing gas plasma, thereby processing the target object.

In the post-processing method according to the third aspect, the process using a corrosive gas, the $O_2$ plasma process, and the fluorine-containing gas plasma process may be performed within the same chamber. In this case, cleaning of the chamber and removal of a deposit from the target object surface are performed by an all-in-one process within a single chamber.

The $O_2$ plasma process and the fluorine-containing gas plasma process may be performed within different chambers. In this case, since the target object is transferred to a different chamber, the influence of the corrosive gas can be essentially cut off. Consequently, the efficiency of removing the deposit from the target object surface is increased in the fluorine-containing gas plasma process, and thus the corrosive gas is reliably prevented from being carried over to the transfer system.

The $O_2$ plasma process may be arranged to remove the corrosive gas sticking to an inner wall of the chamber, a component inside the chamber, and the target object.

The fluorine-containing gas plasma process may be arranged to remove a halogenated compound, particularly a halogenated silicon, sticking to the target object.

The gas containing fluorine may be $CF_4$, $NF_3$, or $SF_6$, or may be a mixture gas of $CF_4$, $NF_3$, or $SF_6$ with $O_2$.

The corrosive gas may be a gas containing a halogen element, and the process using a corrosive gas may be a silicon etching process. In this case, the silicon etching process may be a silicon trench etching process for providing shallow trench isolation.

According to a fourth aspect of the present invention, there is provided a plasma processing apparatus comprising:

a plasma supply source configured to generate plasma;

a chamber in which the plasma is used to perform a plasma process on a target object;

a support on which the target object is placed within the chamber;

exhaust means configured to reduce pressure inside the chamber;

gas supply means configured to supply gas into the chamber; and a control section configured to execute control for performing a plasma processing method for performing a plasma process on the target object placed in the chamber, the method comprising:

a first plasma process of turning a gas containing a halogen element into plasma to generate first plasma, thereby processing the target object;

a second plasma process, subsequent to the first plasma process, of supplying a gas containing oxygen into the chamber to generate second plasma, thereby processing the chamber and the target object; and a third plasma process, subsequent to the second plasma process, of turning a gas containing fluorine into plasma to generate third plasma, thereby processing the target object.

In the fourth aspect, the chamber may be provided with an observation window to monitor an interior thereof from outside, and the observation window preferably comprises a single-crystal body made of fluoride of an element selected from the group consisting of lithium, magnesium, calcium, and barium.

According to a fifth aspect of the present invention, there is provided a computer readable program storage device encoded with instructions that, when executed by a computer, performs a plasma processing method for performing a plasma process on a target object placed in a chamber, the method comprising:

a first plasma process of turning a gas containing a halogen element into plasma to generate first plasma, thereby processing the target object;

a second plasma process, subsequent to the first plasma process, of supplying a gas containing oxygen into the chamber to generate second plasma, thereby processing the chamber and the target object; and a third plasma process, subsequent to the second plasma process, of turning a gas containing fluorine into plasma to generate third plasma, thereby processing the target object.

Each of the plasma processing method and post-processing method according to the present invention can prevent the transfer system as well as the interior of the process chamber from being corroded by a halogen. Consequently, it is possible to preclude particle contamination due to corrosion of the transfer system, thereby providing reliable semiconductor devices. Further, it is possible to improve the durability of the entire system.

DETAILED DESCRIPTION OF THE INVENTION

Figure 1A:
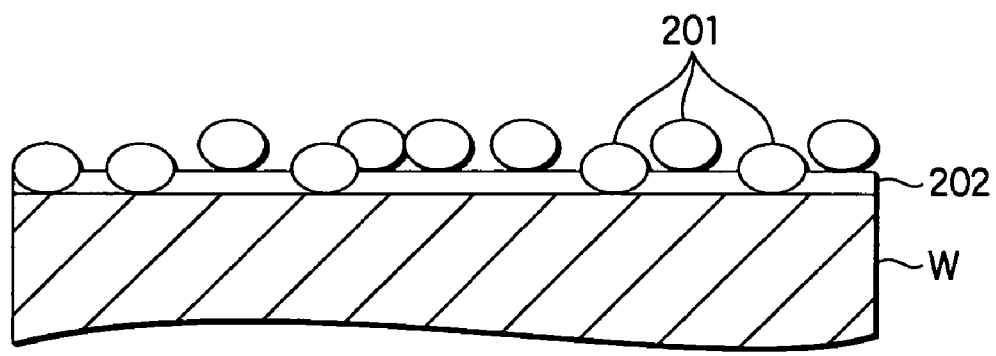
FIG. 1A is a schematic view showing wafer surface state after the first plasma process.

In the present invention, a target object may be a substrate, such as a semiconductor wafer. The substrate may have a silicon layer or metal layer, such as tungsten, formed thereon.

In the present invention, "a gas containing a halogen element" used in a plasma processing method is a gas containing a halogen element, such as chlorine or bromine, as a component, and may be specifically exemplified by hydrogen bromide gas, hydrogen chloride gas, chlorine gas, or a mixture gas thereof. Consequently, for example, the first plasma process may be a plasma etching process using a halogen gas. Specifically, this process may be exemplified by silicon trench etching for providing shallow trench isolation (STI; Shallow Trench Isolation), which is one of the device isolation techniques. Alternatively, this process may be exemplified by etching of a refractory metal layer, such as a tungsten layer, or a silicide layer thereof, such as a WSi layer, which is performed in fabricating a gate electrode, such as a tungsten polycide gate (a multi-layer film of WSi/poly-Si) or a tungsten poly-metal gate (a multi-layer structure of W/WN/poly-Si).

Further, for example, "a gas containing oxygen" may be $O_2$ gas or a mixture gas of $O_2$ gas with an inactive gas, such as a noble gas. Consequently, for example, the second plasma process may be an $O_2$ plasma process using $O_2$ gas plasma. The second plasma process is arranged to remove a halogen gas component (such as $Cl_2$ or HBr) physically adsorbed on the target object due to the first plasma process, and to replace the atmosphere inside the process chamber, e.g., to replace a halogen gas, remaining within the chamber, with $O_2$ gas.

In the plasma processing method according to the present invention, for example, "a gas containing fluorine" may be a fluorocarbon gas, such as $CF_4$, or $NF_3$ or $SF_6$.

Alternatively, this gas may be a mixture gas of a gas, such as $CF_4$, $NF_3$, or $SF_6$, with $O_2$ or a hydrofluorocarbon, such as $CHF_3$, $CH_2F_2$, or $CH_3F$. By adding $O_2$ or a hydrofluorocarbon, the selectivity in removing the deposit is increased. For example, where the first plasma process is etching of silicon on a target object, the deposit sticking to the target object can be removed without etching silicon.

The third plasma process is arranged to utilize the action of active species, such as F radicals, to remove a halogenated silicon ($SiX_4$; X denotes a halogen element, such as Cl or Br, hereinafter), such as $SiCl_4$ or $SiBr_4$ deposited on the target object, such as a semiconductor wafer, due to the first plasma process.

In the method according to the present invention, the first plasma process to the third plasma process may be performed within the same chamber. In this case, the second plasma process is used to replace a halogen atmosphere generated in the chamber by the first plasma process, to prevent corrosion of the chamber, and to remove halogen gas molecules adsorbed on the target object. Then, the third plasma process is used to remove the deposit on the target object.

Alternatively, the first plasma process and the second plasma process may be performed within the same chamber, and the third plasma process may be performed within a different chamber by transferring the target object thereto. In this case, the second plasma process is used to replace a halogen atmosphere generated in the first chamber by the first plasma process, to prevent corrosion of the chamber, and to remove halogen gas molecules adsorbed on the target object. Then, the third plasma process is used to remove the deposit on the target object within a different chamber. In this case, the target object is preferably transferred between the chambers under a vacuum condition.

The conditions for the plasma processes are not limited to specific conditions, but are preferably set in accordance with conditions of a present example described later.

In addition to the first plasma process to the third plasma process, another process may be performed, as needed. For example, where the first plasma process is a silicon etching process, a process of removing a natural oxide film on the silicon surface is preferably performed as a pre-process.

The post-processing method according to the present invention is a processing method to be performed after a process using a corrosive gas. The post-processing method may be arranged to perform an $O_2$ plasma process (cleaning process) and a fluorine-containing gas plasma process (deposit removing process). The $O_2$ plasma process is arranged to use $O_2$ plasma generated by turning a gas containing oxygen into plasma, so as to process a target object processed by the corrosive gas and a chamber used for the process. The fluorine-containing gas plasma process is arranged to turn a fluorine-containing gas into plasma, so as to process the target object. For example, the process using a corrosive gas may be a plasma etching process using a halogen-containing gas as in the first plasma process of the plasma processing method. The $O_2$ plasma process may be performed in the same manner as the second plasma process of the plasma processing method, and the fluorine-containing gas plasma process may be performed in the same manner as the third plasma process.

Figure 1B:
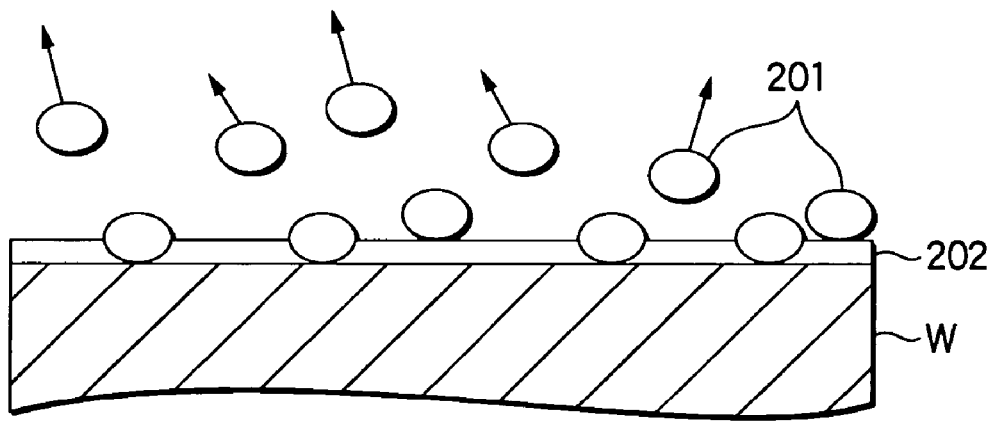
FIG. 1B is a schematic view showing wafer surface state after the second plasma process.
Figure 1C:
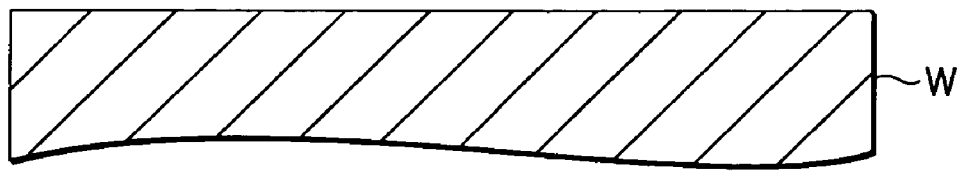
FIG. 1C is a schematic view showing wafer surface state after the third plasma process.

Next, an explanation will be given of effects of the present invention, with reference to FIGS. 1A, 1B and 1C. FIGS. 1A to 1C are schematic views for explaining the principle of the plasma processing method according to the present invention. FIG. 1A, shows the state of a cross section near the substrate surface of a target object or semiconductor wafer (which will be simply referred to as "wafer" hereinafter) W, after the target object is subjected to a silicon etching using a corrosive gas as the first plasma process. Due to the first plasma process, particles 201 based on a halogen, such as $Cl_2$ or HBr, are physically adsorbed on the substrate surface, and a deposit 202 consisting mainly of $SiX_4$ or the like sticks to the substrate surface.

After the first plasma process, when the second plasma process is performed, the particles 201 such as adsorptive materials are sputtered and removed by $O_2$ plasma. As a result, as shown in FIG. 1B, most of the particles 201 are removed, but the deposit 202 remains almost unchanged on the wafer W. Further, also on the inner wall of the chamber used for the first plasma process, particles 201 are removed in the same mechanism, while corrosion thereof is prevented because the atmosphere inside the chamber is replaced.

Then, when the third plasma process is performed on the wafer W, as shown in FIG. 1C, the deposit 202 is removed from the surface (silicon surface) of the wafer W, due to the action of F radicals or the like contained in plasma. During the third plasma process, the deposit 202 is removed in the same mechanism as etching. Further, remaining particles 201 based on a halogen are also removed at the same time. Consequently, even if the wafer W is placed at a position in the transfer system open to atmosphere, such as in a FOUP, no halogen gas is generated, and thus corrosion of the transfer system is prevented.

As described above, during the third plasma process, the deposit 202, such as $SiX_4$, is removed in the same mechanism as etching, and thus it is preferable to obtain a sufficient selectivity relative to an under-layer (for example, Si in the case of a silicon substrate). If the under-layer is etched during the third plasma process, the etching shape formed by the first plasma process is deformed, so semiconductor devices become less reliable. For this reason, the third plasma process is preferably arranged to use a mixture gas of a fluorine-containing gas with a gas that increases the selectivity to silicon, such as $O_2$ or a hydrofluorocarbon. For example, the hydrofluorocarbon may be $CHF_3$, $CH_2F_2$, or $CH_3F$.

Figure 2:
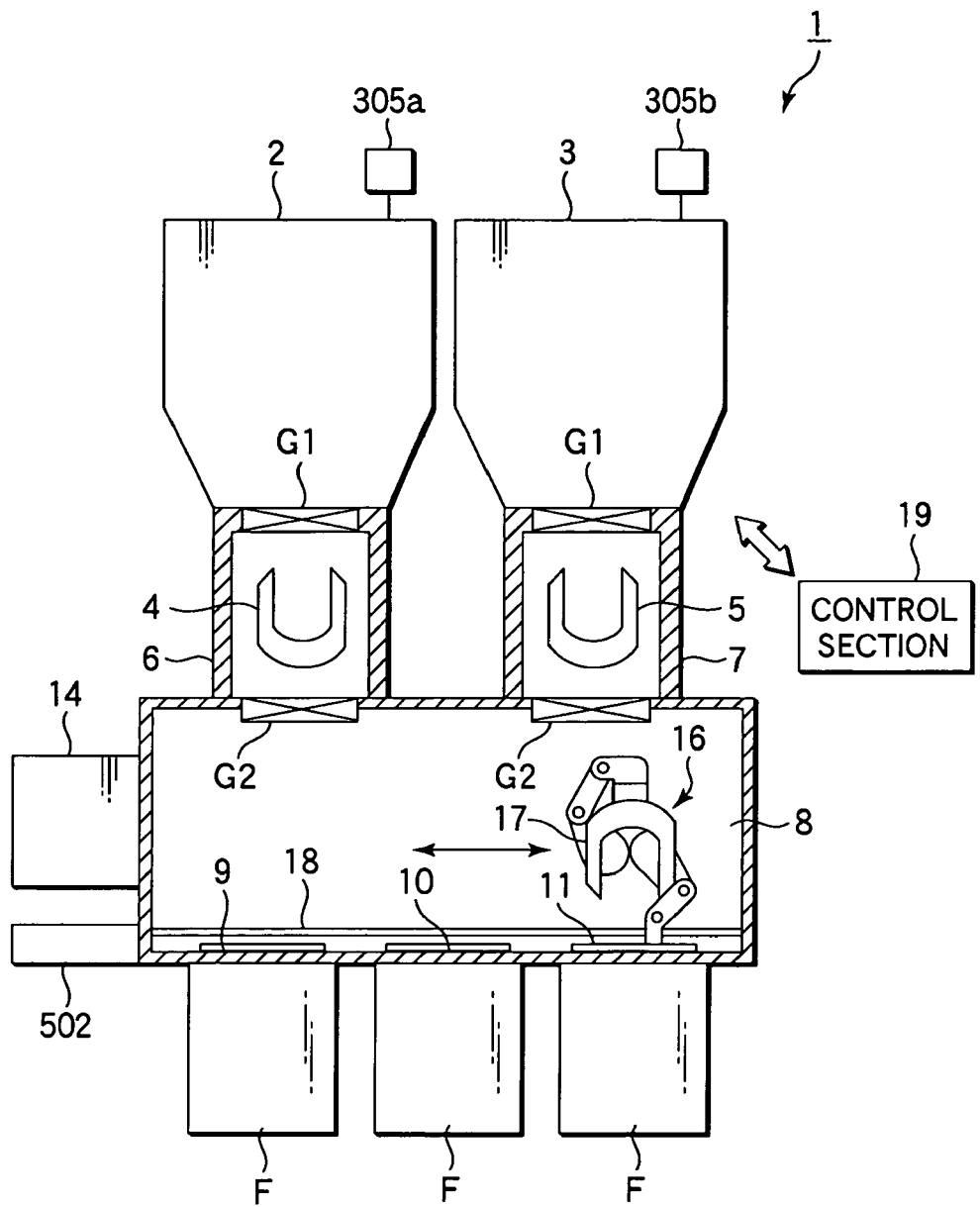
FIG. 2 is a structural view schematically showing a plasma processing apparatus suitable for execution of a method according to the present invention.

Next, an explanation will be given of an embodiment of the present invention, with reference to drawings showing the specific structure of a plasma processing apparatus. FIG. 2 is a sectional plan view schematically showing a plasma processing apparatus suitable for execution of a method according to the present invention. The plasma processing apparatus performs an etching process and post-processes on a target object or wafer W under a predetermined vacuum.

The plasma processing apparatus 1 includes two processing units 2 and 3, each of which is configured to independently perform an all-in-one process from the etching process of a wafer W to the post-processes. The processing units 2 and 3 are respectively connected to load lock chambers 6 and 7 through gate valves G1. The load lock chambers 6 and 7 are connected to a wafer I/O (input/output) chamber 8 on the side opposite the processing units 2 and 3. The wafer I/O chamber 8 is provided with three connection ports 9, 10, and 11 each configured to attach a FOUP F for storing wafers W, on the side opposite the load lock chambers 6 and 7.

The two processing units 2 and 3 respectively communicate with the load lock chambers 6 and 7 when the gate valves G1 are opened, and are isolated from the load lock chambers 6 and 7 when the gate valves G1 are closed. Other gate valves G2 are also disposed at the connecting portions of the load lock chambers 6 and 7 to the wafer I/O chamber 8. The load lock chambers 6 and 7 respectively communicate with the wafer I/O chamber 8 when the gate valves G2 are opened, and are isolated from the wafer I/O chamber 8 when the gate valves G2 are closed.

The load lock chambers 6 and 7 are respectively provided with wafer transfer devices 4 and 5 disposed therein to transfer a target object or wafer W between the processing units 2 and 3 and the wafer I/O chamber 8.

The ceiling of the wafer I/O chamber 8 is provided with a HEPA filter (not shown), through which clean air is supplied into the wafer I/O chamber 8 in a down flow state, so that a wafer W is transferred in and out within a clean air atmosphere at atmospheric pressure. Each of the three connection ports 9, 10, and 11 of the wafer I/O chamber 8 for attaching a FOUP F is provided with a shutter (not shown). A FOUP F with wafers W stored therein or an empty FOUP F is directly connected to each of the connection ports 9, 10, and 11. When a FOUP F is connected, the shutter is opened to allow the FOUP F to communicate with the wafer I/O chamber 8 while preventing invasion of outside air. An alignment chamber 14 is disposed on one side of the wafer I/O chamber 8, and configured to perform alignment of a wafer W.

The wafer I/O chamber 8 is provided with a wafer transfer device 16 disposed therein to transfer a wafer W to and from each FOUP F, and transfer a wafer W to and from each of the load lock chambers 6 and 7. The wafer transfer device 16 has an articulated arm structure, and is arranged to travel on a rail 18 in a direction along which the FOUPs F are arrayed, while supporting a wafer W on a pick 17 at the distal end to transfer it. A control section 19 is configured to control the entire system, such as the operation of the wafer transfer device 16, and to set process conditions at the processing units 2 and 3.

A module controller (which will be simply referred to as "MC" hereinafter) 305*a* is connected to the processing unit 2, and configured to control gas supply and exhaust to and from a chamber 22 described later (see FIG. 4). Similarly, an MC 305*b* is connected to the processing unit 3, and configured to control gas supply and exhaust to and from a chamber 22.

The plasma processing apparatus 1 includes a user interface 502 disposed at one end of the wafer I/O chamber 8 in the longitudinal direction. The user interface 502 has an input portion (key board) and a display portion (monitor), such as an LCD (Liquid Crystal Display), which is used for showing the operational status of the components of the plasma processing apparatus 1.

Figure 3:
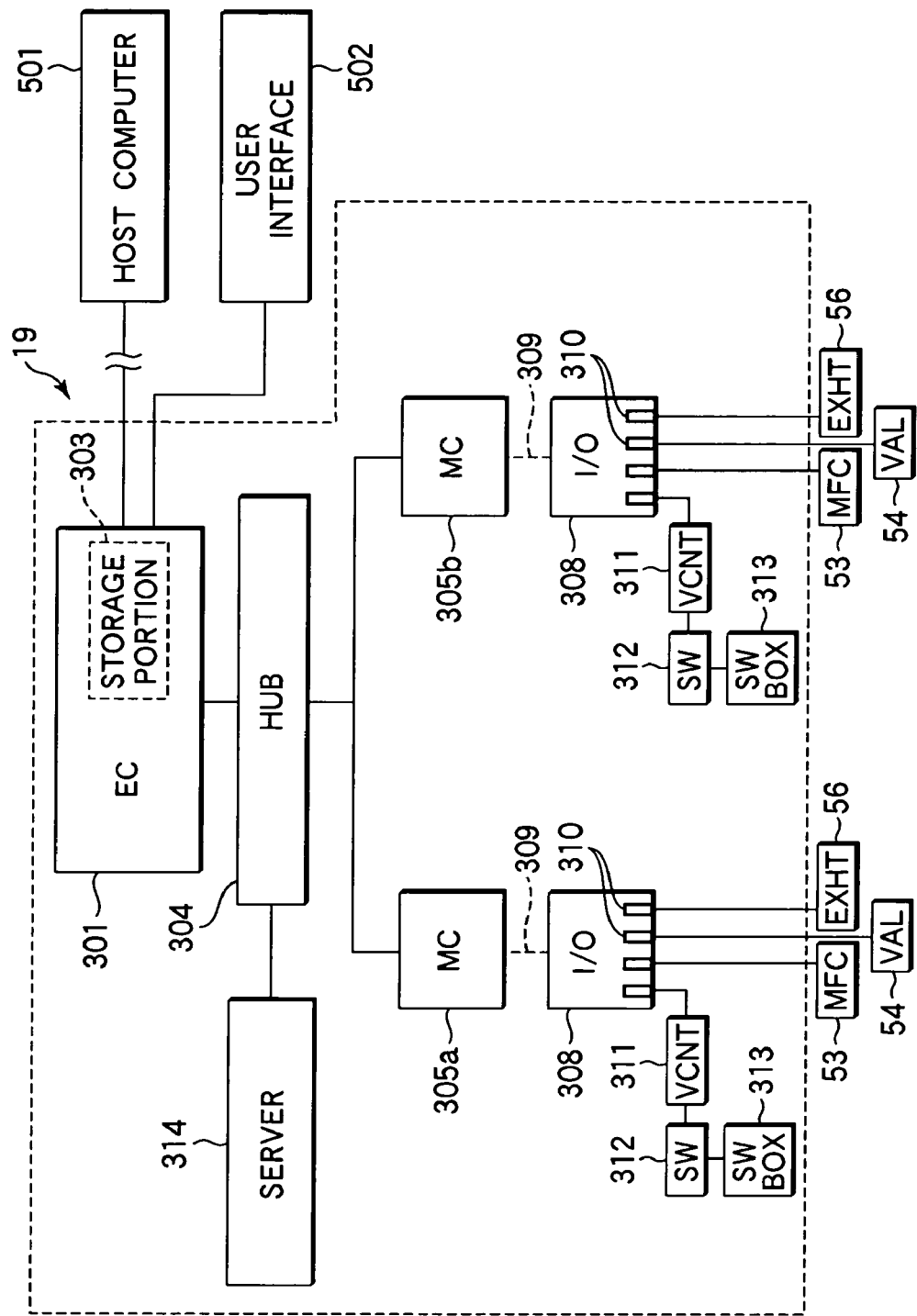
FIG. 3 is a view schematically showing the structure of a control section used in the plasma processing apparatus shown in FIG. 2.

The operation of the entire plasma processing apparatus 1, and the gas supply and exhaust of the processing units 2 and 3 are controlled by the control section 19. FIG. 3 schematically showing the structure of the control section 19. As shown in FIG. 3, the control section 19 includes an EC (Equipment Controller) 301 used as an overall control portion, a plurality of, e.g., two, MCs 305*a* and 305*b* corresponding to the processing units 2 and 3, and a switching hub 304 connecting the MCs 305*a* and 305*b* to the EC 301. Not only for the processing units 2 and 3, MCs may be disposed for, e.g., the load lock chambers 6 and 7 and wafer I/O chamber 8, and supervised or controlled by the EC 301, although they are not shown or described here.

The control section 19 is connected from the EC 301 through an LAN (Local Area Network) to a host computer 501 used as an MES (Manufacturing Execution System) for administrating the manufacturing steps used in the entire factory in which the plasma processing apparatus 1 is installed. The host computer 501 cooperates with the control section 19 to feed-back real time information of the steps used in the factory to a basic operation system (not shown), and make judgments on the steps in consideration of the entire load of the factory and so forth.

The EC 301 is an overall control portion to supervise the MCs 305*a* and 305*b* and control the entire operation of the plasma processing apparatus 1. The EC 301 has a CPU (not shown) and a storage portion 303 including, e.g., a RAM and a HDD. The CPU reads out a program from the storage portion 303, which corresponds to a method of processing a wafer W (i.e., a recipe including conditions of the process gas flow rate and pressure) designated by a user or the like through the user interface 502. Then, the CPU transmits the control program corresponding to the recipe to the MCs 305*a* and 305*b*, so as to control processes performed in the respective processing units 2 and 3.

The MCs 305*a* and 305*b* are ordinary control sections to control the operation of the processing units 2 and 3, respectively. Each of the MCs 305*a* and 305*b* is connected to an I/O (input/output) module 308 through a network 309 realized by an LSI called GHOST (General High-Speed Optimum Scalable Transceiver). In the GHOST network 309, the MC 305*a* or 305*b* corresponds to a master node, while the I/O module 308 corresponds to a slave node.

The I/O module 308 has a plurality of I/O portions 310 (only four of them are shown) connected to respective components (end devices) used for controlling the gas supply and pressure of the chamber 22 within each of the processing units 2 and 3, and are configured to propagate control signals to the end devices and output signals from the end devices. For example, the end devices used for controlling the gas supply and pressure are mass-flow controllers (MFC) 53, valves (VAL) 54, an exhaust system (EXHT) 56 (see FIG. 4 for these members), a pressure gauge (not shown), and a switching box (SW BOX) 313, as described later. In FIG. 3, for the sake of convenience, only the connections of some of the end devices and I/O portions 310 are representatively shown. The GHOST network 309 is also connected to an I/O board (not shown) to control the input/output of digital signals, analog signals, and serial signals at the I/O portions 310.

The switching hub 304 switches connection of the EC 301 to the MCs 305*a* and 305*b* in accordance with control signals from the EC 301.

As described above, in each of the processing units 2 and 3, the corresponding one of the MCs 305*a* and 305*b* collects pressure values inside the chamber 22 measured by the pressure gauge (not shown), and controls the pressure inside the chamber 22 by adjusting the exhaust system (EXHT) 56 based on the pressure values.

For example, each of the MCs 305*a* and 305*b* is configured to communicate various signals and alarms for activation/ deactivation of the exhaust system (EXHT) 56 and so forth through the corresponding I/O module 308. With this arrangement, for example, when a pump status signal and an alarm signal are supplied from the exhaust system (EXHT) 56 to the I/O module 308, they are converted into a serial signal at the I/O portions 310. The serial signal is transmitted through the local GHOST line, a valve count portion (VCNT) 311, and switch portion (SW) 312 to the switching box (SW BOX) 313. Then, the switching box 313 turns on/blinks/turns off display means, such as a light emitting diode (LED). Further, each of the MCs 305a and 305b controls the mass-flow controllers (MFC) 53 and valves (VAL) 54.

According to the control section 19 shown in FIG. 3, a plurality of end devices are not directly connected to the EC 301. The I/O portions 310 connected to the plurality of end devices are combined to be a module, i.e., the I/O module 308, which is connected through the corresponding one of the MCs 305a and 305b and the switching hub 304 to the EC 301, so that the communication system is simplified.

As regards control signals transmitted from the CPU of each of the MCs 305a and 305b, the GHOST for each of the MCs 305a and 305b makes reference to the address of an I/O portion 310 connected to a desired end device, and the address of an I/O module 308 containing this I/O portion 310, so as to capture the address of an I/O portion 310 set out in the control signal. Accordingly, there is no need for the switching hub 304 to inquire the destination of the control signal to the CPU, which can realize smooth propagation of the control signal.

The control section 19 may include a data collection server 314 that serves as a collecting and recording portion for economically collecting and recording data output from the pressure gauge (not shown) used as pressure measuring means. In this case, the data signal output from the pressure gauge (not shown) is obtained as an analog signal, and is then input into the I/O portions 310 and transmitted through the GHOST network 309 and LAN into the data collection server 314.

As described above, the plasma processing apparatus 1 includes the MCs 305a and 305b operated under the control of the overall control section or EC 301. Consequently, it is possible to reliability control the flow rates of, e.g., $Cl_2$ gas, $CF_4$ gas, and $O_2$ gas by the mass-flow controllers (MFC) 53 and valves (VAL) 54, the conductance adjustment of the exhaust system (EXHT) 56, and the activation/deactivation switching of the pump.

According to the plasma processing apparatus 1 described above, one of the wafers W stored in one of the FOUPs F is picked up by the wafer transfer device 16 disposed in the wafer I/O chamber 8, which is set to have a clean air atmosphere at atmospheric pressure. The wafer W is transferred into the alignment chamber 14, and subjected to alignment there. Then, the wafer W is transferred into one of the load lock chambers 6 and 7, and this load lock chamber is vacuum-exhausted. Then, the wafer W is transferred from this load lock chamber into the processing unit 2 or 3 by the corresponding wafer transfer device 4 or 5. Then, the wafer W is subjected to the etching process and post-processes in series within the same processing unit. Thereafter, the wafer W is transferred into one of the load lock chambers 6 and 7 by the corresponding wafer transfer device 4 or 5, and this load lock chamber is returned to atmospheric pressure. Then, the wafer W is transferred from this load lock chamber into one of the FOUPs F by the wafer transfer device 16 disposed in the wafer I/O chamber 8. The operations described above are performed for one lot of wafers W to complete one lot process.

Next, a detailed explanation will be given of the processing unit 2, with reference to FIG. 4. FIG. 4 is a sectional view schematically showing the processing unit 2. As described above, the processing unit 2 is configured to perform a dry etching process defined as "the first plasma process", and then continuously perform "post-processes", i.e., an $O_2$ plasma process defined as "the second plasma process" and a fluorine-containing gas plasma process defined as "the third plasma process" in the same chamber. The processing unit 3 also has the same structure as the processing unit 2.

The processing unit 2 includes upper and lower electrode plates facing in parallel with each other, one of which is connected to a power supply for plasma generation, so that a parallel-plate plasma etching apparatus of the capacitive coupling type is structured.

The processing unit 2 includes a cylindrical process container or chamber 22 made of, e.g., aluminum with a ceramic spraying-processed surface. The chamber 22 is protectively grounded. A susceptor 23 serving as a lower electrode is disposed in the chamber 22 and supported by a support member 24. A wafer W made of, e.g., silicon with a predetermined film formed thereon is placed on the susceptor 23. The support member 24 is supported on a pedestal 26 provided with an elevating mechanism (not shown) through an insulating plate 25 made of a ceramic. The susceptor 23 can be moved up and down by the elevating mechanism. The bottom central portion of the pedestal 26 on the atmospheric side is covered with a bellows 27 to isolate the interior of the chamber 22 from the atmospheric side.

The support member 24 is provided with a cooling medium space 28 formed therein. A cooling medium, such as Galden™, is supplied and circulated in the cooling medium space 28 through a cooling medium feed line 28a. The cold of the cooling medium is transferred to the wafer W through the susceptor 23, and the process surface of the wafer W is thereby controlled to be a desired temperature. In order to effectively cool the wafer W by the cooling medium circulated in the cooling medium space 28 even when the interior of the chamber 22 is held in a vacuum state, a gas passage 29 is formed to supply a heat transmission medium, such as He gas, to the back side of the target object or wafer W. The cold of the susceptor 23 is effectively transmitted to the wafer W through the heat transmission medium, so that the temperature of the wafer W can be accurately controlled.

The top central portion of the susceptor 23 is projected like a circular plate, which is provided with an electrostatic chuck 31 comprising an electrode 32 and insulating layers sandwiching the electrode 32. The electrode 32 is connected to a direct-current (DC) power supply 33, and supplied with a DC voltage therefrom, so that the wafer W is attracted and held by an electrostatic force, such as a Coulomb force. An annular focus ring 35 is disposed on the top of the periphery of the susceptor 23 to surround the wafer W placed on the electrostatic chuck 31 to improve etching uniformity.

A showerhead 41 serving as an upper electrode is disposed above the susceptor 23 to face the susceptor 23 in parallel therewith. The showerhead 41 is supported at the top of the chamber 22 through an insulating body 42, and has a counter face 44 with a number of delivery holes 43 opposite the susceptor 23. The distance between the surface on the wafer W and showerhead 41 is set to be within a range of, e.g., 30 to 90 mm, which is adjustable by the elevating mechanism.

A gas supply port 46 is formed at the center of the showerhead 41, and connected to a gas supply line 47. The gas supply line 47 is connected through a valve 48 to a gas supply system for supplying an etching gas, a cleaning gas, and so forth. For example, the gas supply system includes a $Cl_2$ gas supply source 50, a $CF_4$ gas supply source 51, and an $O_2$ gas supply source 52, and each of which is connected to a line provided with the mass-flow controller 53 and valve 54.

$Cl_2$ gas is used as an etching gas, and $CF_4$ gas and $O_2$ gas are used as post-process gases. Each of them is supplied from the corresponding gas supply source in the gas supply system, through the gas supply line 47 and gas supply port 46 into the space within the showerhead 41, and is then delivered from the gas delivery holes 43.

An exhaust system 56 is connected to the chamber 22 through an exhaust line 55, which is connected to the sidewall of the chamber 22. The exhaust system 56 includes a vacuum pump, such as a turbo-molecular pump, which can vacuum-exhaust the interior of the chamber 22 to a predetermined reduced-pressure atmosphere, such as 1 Pa or less. A transfer port 57 for the wafer W is formed in the sidewall of the chamber 22, and is opened/closed by a gate valve G1 disposed on the sidewall. When the gate valve G1 is opened, the wafer W can be transferred through the transfer port 57 between the chamber 22 and an adjacent load lock chamber 6 (see FIG. 2).

The showerhead 41 serving as the upper electrode is connected to an RF (radio frequency) power supply 60 through a feed line provided with a matching device 61. The RF power supply 60 supplies an RF power with a frequency of, e.g., 60 MHz to the upper electrode or showerhead 41, to form an RF electric field for plasma generation between the upper electrode or showerhead 41 and the lower electrode or susceptor 23. Further, a low-pass filter (LPF) 62 is connected to the showerhead 41.

The susceptor 23 serving as the lower electrode is connected to an RF power supply 70 through a feed line provided with a matching device 71. The RF power supply 70 supplies an RF power with a frequency of, e.g., 13.56 MHz to the lower electrode or susceptor 23, to attract ions in plasma toward the wafer W, thereby realizing etching with high anisotropy. Further, a high-pass filter (HPF) 36 is connected to the susceptor 23.

Figure 4:
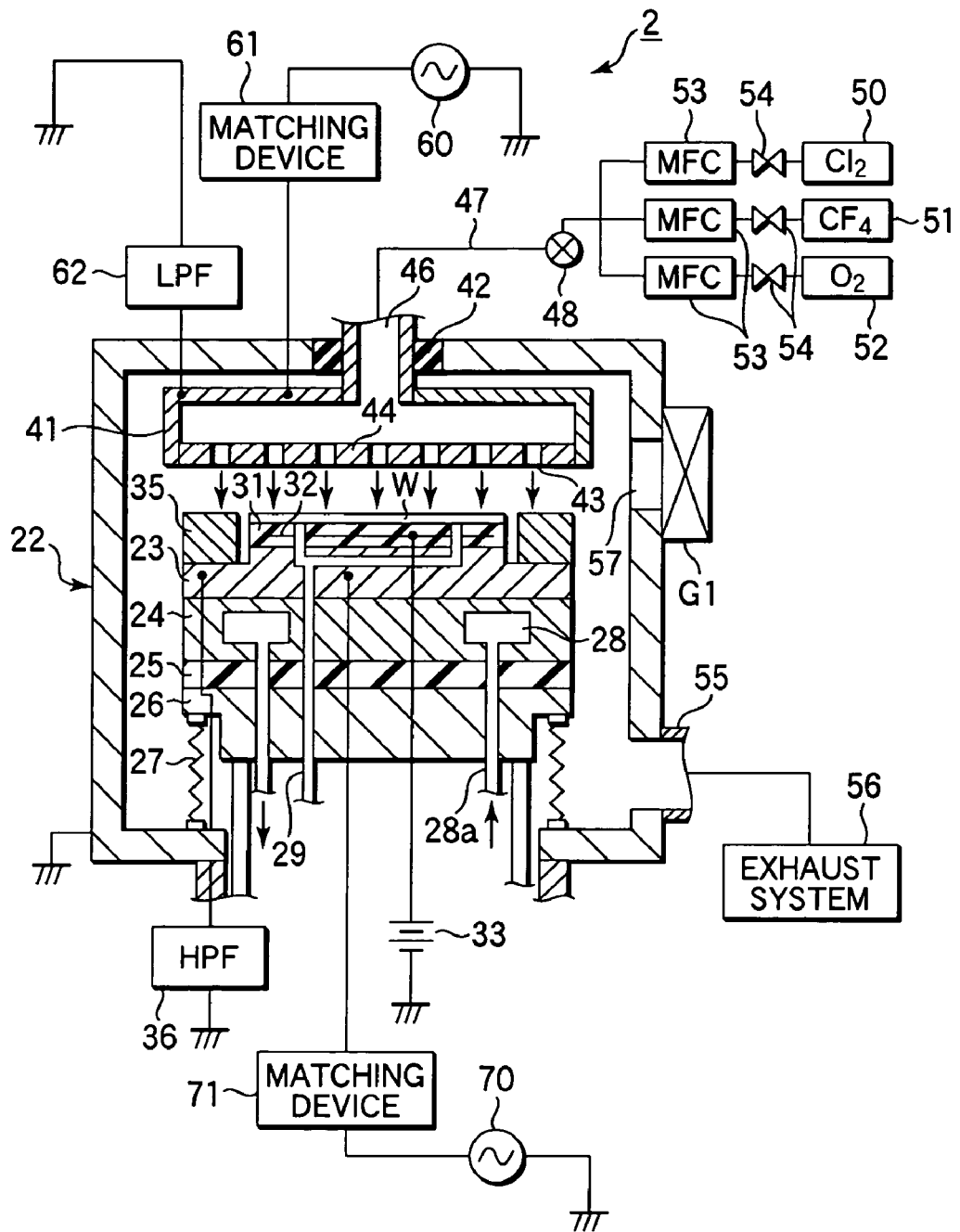
FIG. 4 is a sectional view schematically showing the structure of a processing unit.

When the apparatus shown in FIG. 4 is used to perform etching, the gate valve G1 is opened, and a wafer W is transferred into the chamber 22 and placed on the susceptor 23. Then, the gate valve G1 is closed, and the susceptor 23 is moved up to set the distance between the surface of the wafer W on the susceptor 23 and the showerhead 41 to be within a range of about 30 to 90 mm. Further, the interior of the chamber 22 is exhausted by the vacuum pump of the exhaust system 56 through the exhaust line 55. After the interior of the chamber 22 is set at a reduced pressure, a DC voltage is applied from the DC power supply 33 to the electrode 32 of the electrostatic chuck 31. Consequently, the wafer W is attracted and held by an electrostatic force on the electrostatic chuck 31.

Then, while the interior of the chamber 22 is kept at a predetermined pressure within a range of, e.g., about 1.3 to 13.3 Pa, $Cl_2$ gas used as an etching gas is supplied from the $Cl_2$ gas supply source 50 into the chamber 22. Then, an RF power of, e.g., 60 MHz is applied from the RF power supply 60 to the showerhead 41 to generate an RF electric field between the upper electrode or showerhead 41 and the lower electrode or susceptor 23, so as to turn $Cl_2$ gas into plasma.

As described above, the etching gas plasma is used to etch the wafer W. At this time, an RF power with a predetermined frequency is applied from the RF power supply 70 to the lower electrode or susceptor 23 to attract ions in the plasma toward the susceptor 23.

When the processing unit 2 is used to perform the post-processes, i.e., a cleaning process by $O_2$ gas and a deposit removing process by $CF_4$ gas, $O_2$ gas and $CF_4$ gas are respectively used in place of the etching gas or $Cl_2$ gas, to perform a plasma process in the same manner.

For example, the cleaning process by $O_2$ gas may be arranged such that the pressure inside the chamber 22 is set to be within a range of about 1.3 to 13.3 Pa, the upper electrode or showerhead 41 is supplied with an RF power at a level within a range of 500 to 800 W, the lower electrode or susceptor 23 is supplied with an RF power at 0 W (i.e., supplied with no RF power), and $O_2$ gas is supplied at a flow rate within a range of about 50 to 400 mL/min. Further, the temperature inside the chamber 22 is preferably set to be within a range of about 70 to 90 at the showerhead 41, within a range of about 50 to 70° C. at the sidewall, and within a range of about 10 to 80° C. at the susceptor 23 (or wafer W). Under the conditions described above, the cleaning process by $O_2$ gas may be performed for about 3 to 10 seconds.

The deposit removing process by $CF_4$ gas may be performed under the same conditions as the cleaning process by $O_2$ gas, except that $CF_4$ gas is supplied at a flow rate within a range of about 50 to 400 mL/min, in place of $O_2$ gas. Where $CF_4$ gas is mixed with $O_2$ gas at a predetermined ratio, the selectivity of deposit relative to silicon is increased, so that only the deposit is preferentially removed, which is advantageous.

As described above, it is possible to clean the chamber 22, and remove the deposit on the surface of the target object or wafer W, by an all-in-one process within the single chamber 22.

Figure 5:
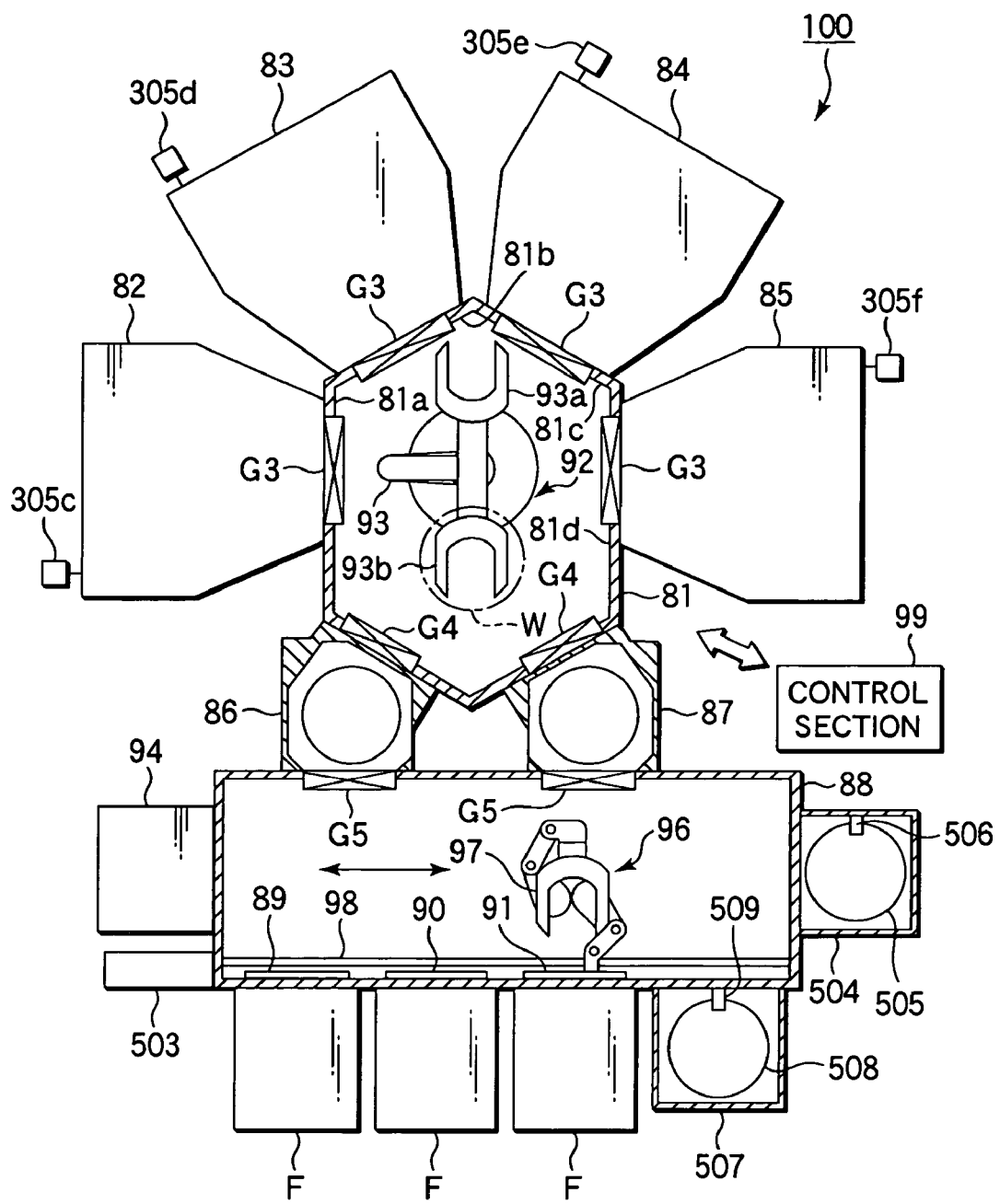
FIG. 5 is a structural view schematically showing an alternative plasma processing apparatus suitable for execution of a method according to the present invention.

FIG. 5 is a structural view schematically showing a plasma processing apparatus of the multi-chamber type. The plasma processing apparatus 100 includes etching processing units 82 and 83 each configured to perform the etching process and $O_2$ plasma process on a wafer W, and $CF_4$ plasma processing units 84 and 85 each configured to perform the fluorine-containing gas plasma process. The plasma processing apparatus 100 includes a hexagonal wafer transfer chamber 81, and four sidewalls of the chamber 81 respectively have connection ports 81a, 81b, 81c, and 81d connected to predetermined processing units, respectively. Specifically, the connection port 81a is connected to the etching processing unit 82, the connection port 81b is connected to the etching processing unit 83, the connection port 81c is connected to the $CF_4$ plasma processing unit 84, and the connection port 81d is connected to the $CF_4$ plasma processing unit 85. MCs 305c to 305f or module controllers are respectively connected to the etching processing units 82 and 83 and $CF_4$ plasma processing units 84 and 85, and each configured to control the gas supply and pressure of the chamber 22. The MCs 305c to 305f have the same structure and function as those of the MCs 305a and 305b described above, and thus the description thereof will be omitted (see FIG. 3).

Further, the other two sidewalls of the wafer transfer chamber 81 are respectively connected to load lock chambers 86 and 87. The load lock chambers 86 and 87 are connected to a wafer I/O (input/output) chamber 88 on the side opposite the wafer transfer chamber 81. The wafer I/O chamber 88 is provided with three connection ports 89, 90, and 91 each configured to attach a FOUP F for storing wafers W, on the side opposite the load lock chambers 86 and 87.

The etching processing units 82 and 83, $CF_4$ plasma processing units 84 and 85, and load lock chambers 86 and 87 are respectively connected to the wafer transfer chamber 81 through gate valves G3 and G4. These chambers respectively communicate with the wafer transfer chamber 81 when the gate valves G3 and G4 are opened, and are isolated from the wafer transfer chamber 81 when the gate valves G3 and G4 are closed. Other gate valves G5 are also disposed at the connecting portions of the load lock chambers 86 and 87 to the wafer I/O chamber 88. The load lock chambers 86 and 87 respectively communicate with the wafer I/O chamber 88 when the gate valves G5 are opened, and are isolated from the wafer I/O chamber 88 when the gate valves G5 are closed.

The wafer transfer chamber 81 is provided with a wafer transfer device 92 disposed therein to transfer a target object or wafer W to and from the etching processing units 82 and 83, $CF_4$ plasma processing units 84 and 85, and load lock chambers 86 and 87. The wafer transfer device 92 is located substantially at the center of the wafer transfer chamber 81. The wafer transfer device 92 includes a rotatable and extendable portion 93 that can rotate and extend/contract, and two blades 93a and 93b connected to the distal end of the portion 93, each for supporting a wafer W. The two blades 93a and 93b are attached to the rotatable and extendable portion 93 to face in opposite directions. The wafer transfer chamber 81 is configured to be held at a predetermined vacuum.

The wafer transfer device is not limited to that shown in FIG. 5, and, for example, it may be a wafer transfer device having two transfer arms of the scalar arm type. This wafer transfer device having two transfer arms of the scalar arm type may be moved back and forth along a guide rail extending inside a wafer transfer chamber that has a more elongated shape than that shown in FIG. 5, so as to transfer a wafer W to and from the etching processing units 82 and 83, $CF_4$ plasma processing units 84 and 85, and load lock chambers 86 and 87.

The ceiling of the wafer I/O chamber 88 is provided with a HEPA filter (not shown), through which clean air is supplied into the wafer I/O chamber 88 in a down flow state, so that a wafer W is transferred in and out within a clean air atmosphere at atmospheric pressure. Each of the three connection ports 89, 90, and 91 of the wafer I/O chamber 88 for attaching a FOUP F is provided with a shutter (not shown). A FOUP F with wafers W stored therein or an empty FOUP F is directly connected to each of the connection ports 89, 90, and 91. When a FOUP F is connected, the shutter is opened to allow the FOUP F to communicate with the wafer I/O chamber 88 while preventing invasion of outside air.

An alignment chamber 94 is disposed on one side of the wafer I/O chamber 88, and configured to perform alignment of a wafer W. A user interface 503 is disposed at the same end of the wafer I/O chamber 88 where the alignment chamber 94 is disposed. The user interface 503 has an input portion (key board) and a display portion (monitor), such as an LCD (Liquid Crystal Display), which is used for showing the operational status of the components of the plasma processing apparatus 100.

An IM (Integrated Metrology) 504 is disposed on the wafer I/O chamber 88 on the side opposite the alignment chamber 94. The IM 504 is a measuring portion used for accurately obtaining fluctuations in CD (Critical Dimension), and fluctuations in film thickness, such as those of a gate insulating film and a capacitive insulating film. The IM 504 is provided with a wafer table 505 and a sensor 506. For example, where the CD value is measured, the sensor 506 may be formed of optical measuring means for measuring processed pattern dimensions on a wafer W, or may be formed of a CD-SEM (Critical Dimension Measurement Scanning Electron Microscope) or electron beam holography. Where the film thickness is measured, the sensor 506 may be formed of an X-ray photoelectron spectroscopic analysis apparatus (XPS), Auger electron spectroscopic analysis apparatus (AES), or vacuum ultraviolet-ray (VUV) ellipsometry apparatus.

Further, a particle examination portion 507 is disposed on the wafer I/O chamber 88 on the same side as the FOUPs F. The particle examination portion 507 is a portion for detecting particles (fine particles) on the surface of a wafer W. This portion 507 comprises a wafer table 508 and optical measuring means 509 of, e.g., the scattered light detection type or optical image comparison type.

The wafer I/O chamber 88 is provided with a wafer transfer device 96 disposed therein to transfer a wafer W to and from each FOUP F, and transfer a wafer W to and from each of the load lock chambers 86 and 87. The wafer transfer device 96 has an articulated arm structure, and is arranged to travel on a rail 98 in a direction along which the FOUPs F are arrayed, while supporting a wafer W on a pick 97 at the distal end to transfer it.

The plasma processing apparatus 100 includes a control section 99 configured to control the entire system, such as the operation of the wafer transfer devices 92 and 96, and to set process conditions at the etching processing units 82 and 83 and $CF_4$ plasma processing units 84 and 85. The control section 99 has the same structure as the control section 19 of the plasma processing apparatus 1 shown in FIG. 3, and thus the description thereof will be omitted. As described above, the plasma processing apparatus 100 includes the control section 99, and the MCs 305c to 305f operated under the control of the overall control section or EC 301. Consequently, it is possible to reliability control, e.g., the flow rates of the process gases supplied into the chamber, the switching of the gas type, and the pressure inside the chamber.

According to the plasma processing apparatus 100 described above, one of the wafers W stored in one of the FOUPs F is picked up by the wafer transfer device 96 disposed in the wafer I/O chamber 88, which is set to have a clean air atmosphere at atmospheric pressure. The wafer W is transferred into the alignment chamber 94, and subjected to alignment there. Then, the wafer W is transferred into one of the load lock chambers 86 and 87, and this load lock chamber is vacuum-exhausted. Then, the wafer W is taken out of this load lock chamber by the wafer transfer device 92 disposed in the wafer transfer chamber 81.

Then, the wafer W thus taken out is transferred into the etching processing unit 82 or 83, and is subjected to the etching process and the $O_2$ plasma process in series. Then, the wafer W is transferred by the wafer transfer device 92 from the etching processing unit 82 or 83 into the $CF_4$ plasma processing unit 84 or 85, and is subjected to the $CF_4$ plasma process. That is, according to this plasma processing apparatus 100, the etching process and $O_2$ plasma process are performed in the etching processing unit 82 or 83, and then, without breaking vacuum, the $CF_4$ plasma process is continuously performed in the $CF_4$ plasma processing unit 84 or 85. Thereafter, the wafer W is transferred into one of the load lock chambers 86 and 87 by the wafer transfer device 92, and this load lock chamber is returned to atmospheric pressure. Then, the wafer W is transferred from this load lock chamber into one of the FOUPs F by the wafer transfer device 96 disposed in the wafer I/O chamber 88. The operations described above are performed for one lot of wafers W to complete one lot process.

Each of the etching processing units 82 and 83 and $CF_4$ plasma processing units 84 and 85 of the plasma processing apparatus 100 may have essentially the same structure as that shown in FIG. 4, except that the gas supply system differs from the other. Specifically, each of the etching processing units 82 and 83 includes a system for supplying $Cl_2$ gas used as an etching gas and a system for supplying $O_2$ gas used as a cleaning gas, while each of the $CF_4$ plasma processing units 84 and 85 includes a system for supplying $CF_4$ gas. Further, the etching process, $O_2$ plasma process, and $CF_4$ plasma process performed in the plasma processing apparatus 100 may be arranged in accordance with the respectively processes performed in the processing unit 2 shown in FIG. 4.

The $O_2$ plasma process or second plasma process is used to replace a halogen atmosphere generated in the first chamber (i.e., each of the etching processing units 82 and 83) by the etching process or first plasma process, to prevent corrosion of the chamber, and to remove halogen gas molecules adsorbed on the wafer W. Then, the $CF_4$ plasma process or third plasma process is used to remove a deposit on the wafer W within a different chamber (i.e., each of the $CF_4$ plasma processing units 84 and 85). In this case, since the wafer W is transferred to a different chamber for the $CF_4$ plasma process, the influence of a halogen atmosphere within the chamber used for the etching process can be essentially cut off. Consequently, a corrosive gas is reliably prevented from being generated on the transfer system.

Figure 6A:
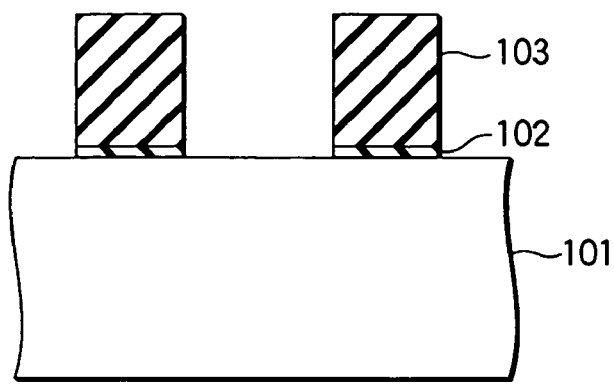
FIGS. 6A, 6B and 6C are sectional views schematically showing a wafer, in a case where a method according to the present invention is applied to trench etching for STI.
Figure 6B:
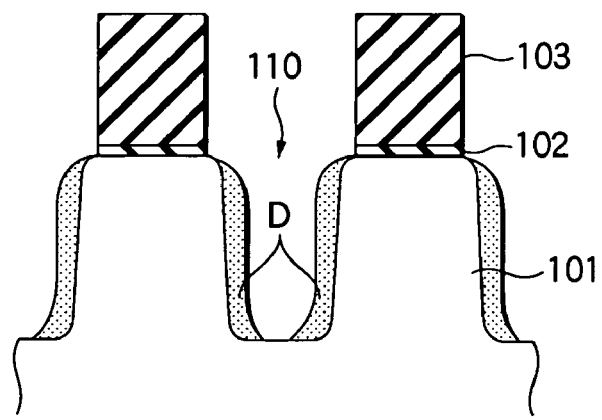
Figure 6C:
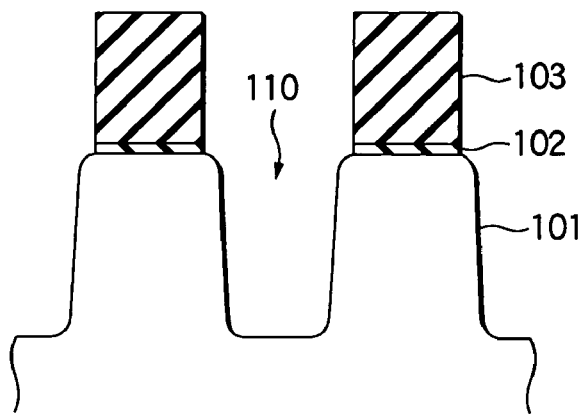

Next, an explanation will be given of a specific application of a plasma processing method according to the present invention. FIGS. 6A, 6B and 6C are enlarged sectional side views schematically showing the main portion of a wafer W, in a case where a plasma processing method according to the present invention is applied to silicon trench etching for STI and post-processes thereof. As shown in FIG. 6A, an insulating film 102, such as $SiO_2$, and a mask film 103, such as $Si_3N_4$, are disposed in this order on a silicon substrate 101 forming a wafer W. The mask film 103 has been patterned in a predetermined shape by a lithography technique to serve as a hard mask.

Then, as shown in FIG. 6B, plasma etching is performed on the silicon substrate 101, using the mask film 103 as a mask, thereby forming a trench 110 (the first plasma process). In forming the trench 110, Si reacts with a halogen in an etching gas, and a deposit D, such as $SiX_4$, is thereby generated.

Then, an $O_2$ plasma process is performed within the chamber to remove a halogen gas sticking to the inner wall of the chamber 22, components inside the chamber, and the wafer W (the second plasma process). During this process, most of the deposit D is not removed, and remains sticking to the wall of the trench 110. If the deposit D is brought into contact with atmosphere, it reacts with moisture contained in atmospheric and generates a corrosive gas, such as HBr or HCl, which may corrode the transfer system.

Thereafter, a $CF_4$ plasma process is performed within the same chamber or a different chamber to which the wafer W is transferred (the third plasma process). Consequently, as shown in FIG. 6C, the deposit D is removed. At this time, $CF_4$ gas is mixed with $O_2$ gas at a predetermined ratio, so that unnecessary etching of the silicon substrate 101 is suppressed to effectively remove the deposit D with high selectivity, which can provide fairly reliable semiconductor devices.

Figure 7A:
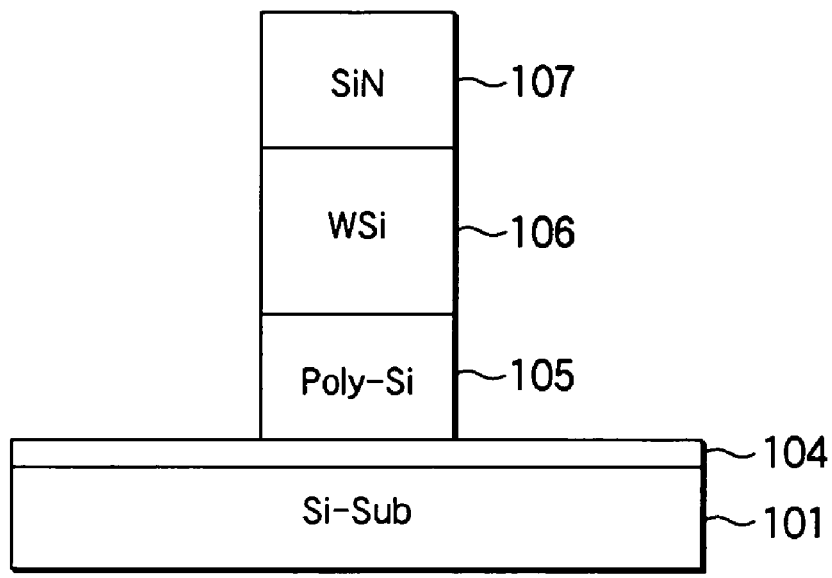
FIGS. 7A and 7B are sectional views schematically showing a gate electrode to which a method according to the present invention can be applied for etching steps.
Figure 7B:
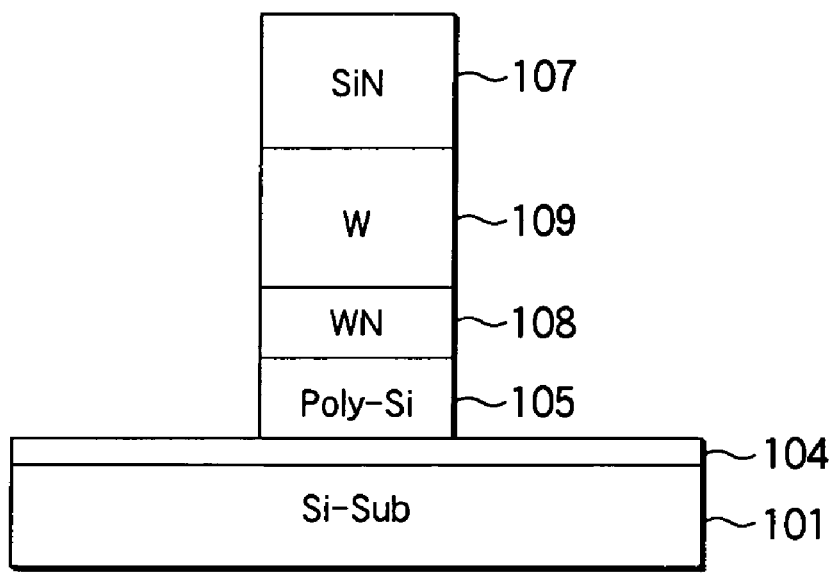

Alternatively, for example, a plasma processing method according to the present invention may be applied to an etching process used in forming a gate electrode with a structure shown in FIGS. 7A and 7B. FIG. 7A, shows a gate electrode with a tungsten polycide structure comprising a poly-silicon layer 105 and a tungsten silicide (WSi) layer 106 stacked thereon. FIG. 7B, shows a gate electrode with a tungsten poly-metal structure comprising a poly-silicon layer 105 and a tungsten layer 109 stacked thereon with a barrier layer 108 interposed therebetween. In FIGS. 7A and 7B, a reference symbol 101 is an Si substrate (silicon substrate), 104 is a gate insulating film of, e.g., $SiO_2$, 107 is a hard mask layer 107 of, e.g., silicon nitride.

Taking the gate electrode shown in FIG. 7B, as an example, a fabrication method will be exampled. At first, a $P^+$- or $N^+$-doped well region (diffusion region; not shown) is formed in the Si substrate 101, and the gate insulating film 104 is then formed by, e.g., a thermal oxidation process. Then, the poly-silicon layer 105 is formed by CVD on the gate insulating film 104, and the barrier layer 108 is then formed on the poly-silicon layer 105. Further, using tungsten, which is a refractory electrode material, the tungsten layer 109 is formed by, e.g., a CVD method or sputtering method. In this example, the barrier layer 108 is made of tungsten nitride.

Then, the hard mask layer 107 of, e.g., silicon nitride is formed on the tungsten layer 109, and a photo-resist film (not shown) is further formed. Then, the hard mask layer 107 is etched by a lithography technique using the photo-resist film as a mask. Then, the tungsten layer 109, barrier layer 108, and poly-silicon layer 105 are sequentially etched to form the gate electrode, using the photo-resist film and hard mask layer 107 or the hard mask layer 107 as a mask.

In this sequential etching, when the tungsten layer 109 is etched (in the first plasma process), a halogen gas, such as $Cl_2$, is often used, and thus a reaction product or deposit of, e.g., $WCl_6$ is generated, and sticks to the surface of the wafer W. Accordingly, in addition to the second plasma process using $O_2$ plasma, the third plasma process using $CF_4$ gas is performed to remove the deposit from the wafer W. Consequently, it is possible to prevent the transfer system from suffering corrosion caused by the medium of the wafer W.

Next, a detailed explanation will be given of the present invention, with reference to a present example and comparative examples, but the present invention is not limited by these examples. In the present example and comparative examples, a processing unit structured as shown in FIG. 4 was used, and a plasma process was performed under the following conditions.

<First Plasma Process (Etching Process)>

Silicon trench etching for STI was performed using an etching gas containing $Cl_2$ and HBr considered as corrosive gases.

<Second Plasma Process ($O_2$ Plasma Process)>

Process pressure; 2.6 Pa (20 mTorr),

RF power; the upper electrode at 650 W and the lower electrode at 0 W, $O_2$ gas flow rate; 200 mL/min (sccm), Back pressure; the central portion/edge portion of a wafer W=400 Pa/400 Pa (3 Torr/3 Torr), and Temperature inside the chamber; the showerhead at 80° C., the sidewall at 60° C., and the susceptor at 20° C.

<Third Plasma Process ($CF_4$ Plasma Process)>

The process was performed under the same conditions as described above except that $CF_4$ gas was used at a flow rate of 200 mL/min (sccm), in place of $O_2$ gas. Further, a process using a 4%-$H_2$ process gas was performed under the same conditions.

An etching process using an etching gas containing $Cl_2$ and HBr considered as corrosive gases was performed on a silicon wafer W having a multi-layer structure as shown in FIG. 6, and the post-processes were then performed under conditions set to be different for the respective test divisions. The test divisions were arranged as shown in Table 1. Specifically, 10 blanket silicon wafers were processed under each of a case where only the $O_2$ plasma process was performed for 10 seconds (comparative example 1), a case where the $O_2$ plasma process was performed for 5 seconds and the 4%-$H_2$ plasma process was then performed for 5 seconds (comparative example 2), and a case where the $O_2$ plasma process was performed for 5 seconds and the $CF_4$ plasma process was then performed for 5 seconds (present example 1). Then, the amount of chlorine in the atmosphere within a transfer passage (within a FOUP) was measured by a halogen detector tube after the wafers were left untouched for 10 minutes. The measurement was performed at two positions inside the FOUP, i.e., upper and lower positions that are 65 mm distant upward and 45 mm distant downward from the wafer storing positions, respectively. Table 1 shows the result of the experiment.

TABLE 1

|  |  | Comparative Example 1 $O_2$ plasma only | Comparative Example 2 $O_2$ plasma + 4%-$H_2$ plasma | Present Example 1 $O_2$ plasma + $CF_4$ plasma |
|---|---|---|---|---|
| Upper position in FOUP | Chlorine (ppm/FOUP) | 1.5 | 1.2 | 0.3 |
| Lower position in FOUP | Chlorine (ppm/FOUP) | 1.3 | 1.0 | 0.1 |

As shown in Table 1, the amount of chlorine in the FOUP was large in the comparative example 1 using the $O_2$ plasma process only, and the comparative example 2 using the $O_2$ plasma process (for 5 seconds) and then the 4%-$H_2$ plasma process (for 5 seconds). It is thought that this was caused because chlorine was sublimated from a deposit remaining on the wafer in a place open to atmosphere. In this case, the transfer system may be corroded.

On the other hand, the amount of chlorine in the FOUP was very small (0.3 ppm or less/FOUP) in the present example 1 using the $O_2$ plasma process and then the $CF_4$ plasma process. Accordingly, it has been confirmed that the method according to the present invention is effective in preventing the transfer system from being corroded. Further, the deposit inside the chamber was also essentially removed by this method using a combination of the $O_2$ plasma process and $CF_4$ plasma process. Accordingly, it has been confirmed that this method is effective in preventing the chamber from being corroded.

Then, the amount of halogen ($Cl^-$ and $Br^-$) on a silicon wafer was measured, after the wafer was processed in accordance with the present example 1 and comparative examples 1 and 2. In order to measure the amount of halogen on the silicon wafer, the silicon wafer was immersed in 100 mL water to elute the halogen, and the solution thus obtained by this elution was examined by ion chromatography. Table 2 shows the result of the experiment.

TABLE 2

|  |  | Comparative Example 1 $O_2$ plasma only | Comparative Example 2 $O_2$ plasma + 4%-$H_2$ plasma | Present Example 1 $O_2$ plasma + $CF_4$ plasma |
|---|---|---|---|---|
| Halogen amount | $Cl^-$ (µg/wafer) | 18.3 | 14.0 | 5.0 |
| Halogen amount | $Br^-$ (µg/wafer) | 2.9 | 8.7 | 0.8 |

As shown in Table 2, the present example 1 rendered a remarkably smaller amount of halogen sticking to the wafer, as compared to the comparative examples 1 and 2.

Further, the process characteristics of the respective test divisions were examined for the present example 1 and comparative examples 1 and 2. Table 3 shows the result of the examination. Specifically, Table 3 shows decrease in the film thickness of the mask layer (SiN) ([the film thickness before the post-processes]−[the film thickness after the post-processes]), and silicon trench depth ([the total depth including the mask layer]−[10 nm]−[the film thickness of the remaining mask layer]).

TABLE 3

|  | Comparative Example 1 $O_2$ plasma only | Comparative Example 2 $O_2$ plasma + 4%-$H_2$ plasma | Present Example 1 $O_2$ plasma + $CF_4$ plasma |
|---|---|---|---|
| Film thickness decrease (Unit; nm) | 30.92 | 30.65 | 30.54 |
| Trench depth (Unit; nm) | 193.5 | 197.9 | 194.5 |

As shown in Table 3, the etching profile obtained by the present example 1 using the $O_2$ plasma process and then the $CF_4$ plasma process was almost the same as that provided by the comparative example 1 using the $O_2$ plasma process only. Accordingly, it has been confirmed that the third plasma process does not bring about a large change in the etching profile.

Figure 8:
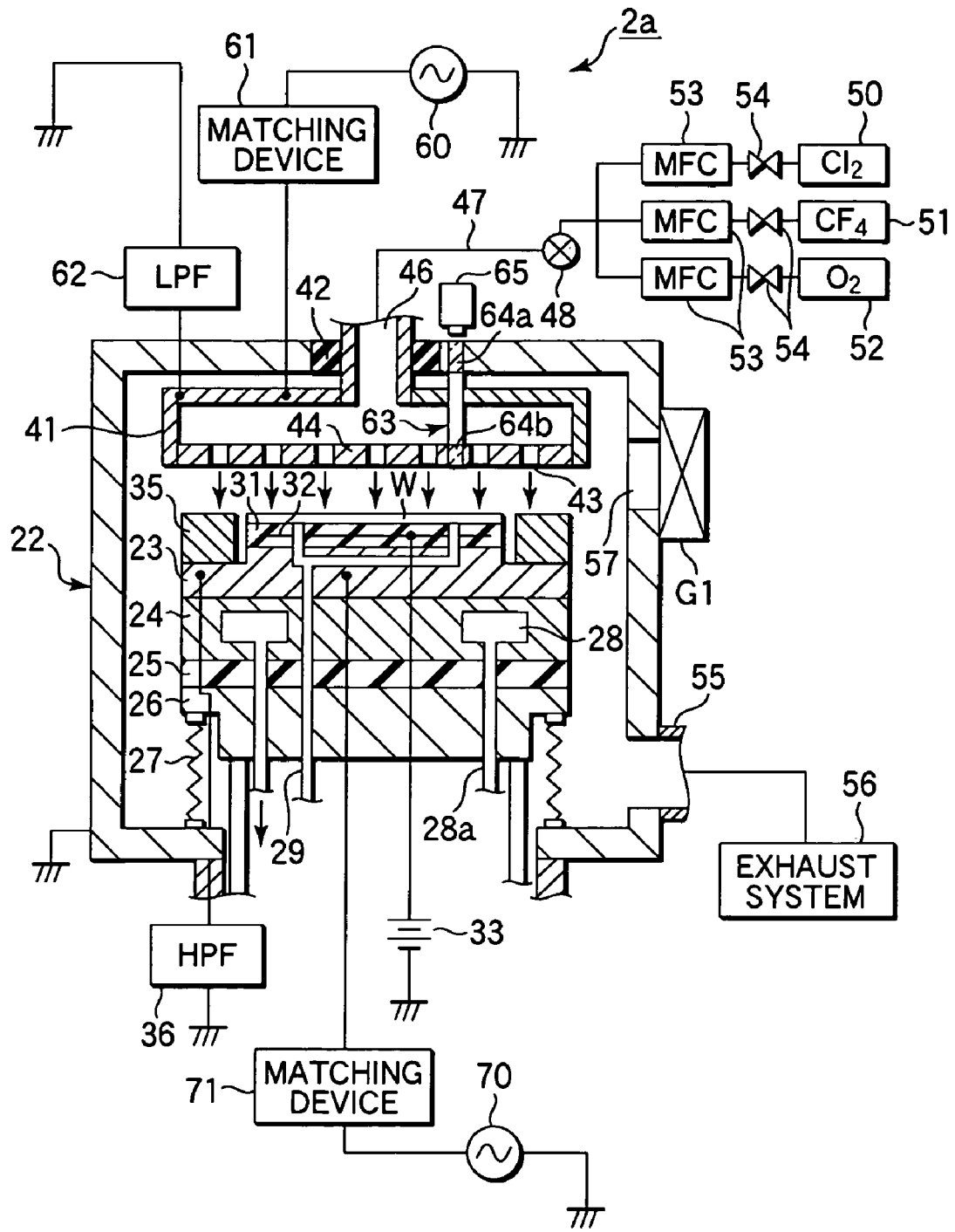
FIG. 8 is a section view showing the structure of an alternative processing unit.
Figure 9:
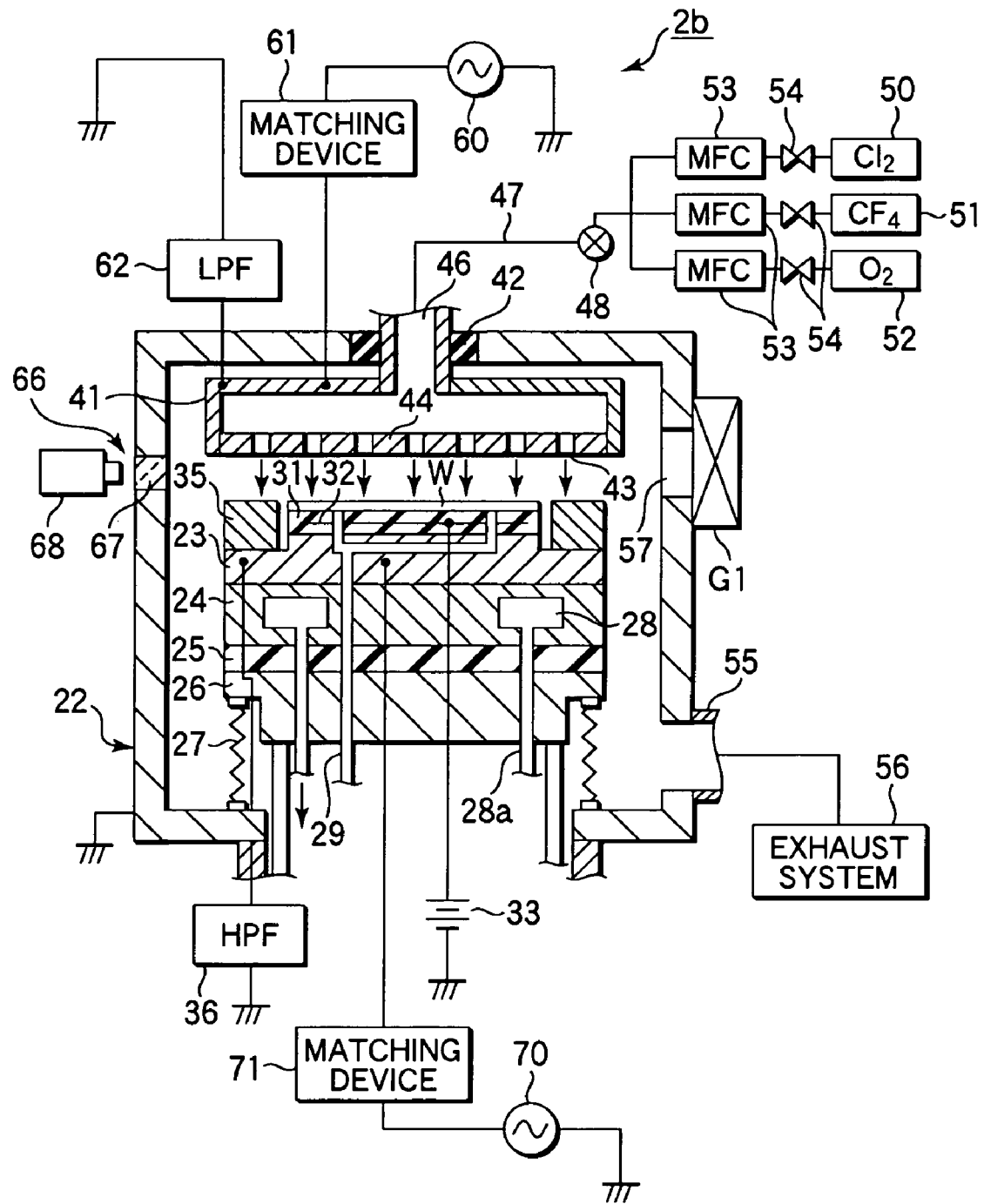
FIG. 9 is a section view showing the structure of a further alternative processing unit.

FIGS. 8 and 9 are views showing the structures of alternative processing units applicable to the plasma processing apparatus 1 or plasma processing apparatus 100.

The processing unit 2a shown in FIG. 8 includes a window 63 penetrating from the upper wall of a chamber 22 through a showerhead 41, to monitor the inside of the chamber 22. The window 63 is provided with light transmitting members 64a and 64b used as window components. A measuring unit 65 by using a photo interferometry method is disposed outside the chamber 22. The measuring unit 65 measures the film thickness of a thin layer formed on the wafer W, or the etching depth, e.g. the trench depth, through the light transmitting members 64a and 64b of the window 63 so as to detect the etching end point and so forth.

Similarly, the processing unit 2b shown in FIG. 9 includes a window 66 formed in the sidewall of a chamber 22 to monitor the inside of the chamber 22. The window 66 is provided with a light transmitting member 67 as a window component. A measuring unit 68 is disposed outside the chamber 22 to monitor light emitted from plasma through the light transmitting member 67. The measuring unit 68 measures the intensity of light emitted from, e.g., radicals of plasma in the plasma generation space within the chamber 22, so as to detect the etching end point and so forth.

In the processing units 2a and 2b shown in FIGS. 8 and 9, the light transmitting members 64a, 64b, and 67 are made of, e.g., a single-crystal body of a fluoride of lithium, magnesium, calcium, or barium. Specifically, such a fluoride single crystal is exemplified by lithium fluoride (LiF) single crystal, magnesium fluoride ($MgF_2$) single crystal, calcium fluoride ($CaF_2$) single crystal, and barium fluoride ($BaF_2$) single crystal. Theses fluorides are higher in plasma resistance as compared to quartz, which is a representative material conventionally used for windows. Further, theses fluorides can greatly reduce metal contamination due to, e.g., Al, and particle generate, as compared to sapphire.

For example, an experiment was conducted to compare sapphire and calcium fluoride in terms of increasing rates of the number of particles from the beginning to the end of a plasma process performed for a certain period. As a result, the number of particles increased by the process was 69 in the case of sapphire, while the number was reduced to 16 in the case of calcium fluoride. Further, the fluoride single crystals are high in transmittancy of light with a shorter wavelength, such as 400 nm or less. Accordingly, where the window material is selected from the fluoride single crystals, the measurement sensitivity is improved for light emitted from plasma.

As described above, the processing units 2a and 2b shown in FIGS. 8 and 9 include the light transmitting members 64a, 64b, and 67 made of a single-crystal body of a fluoride of lithium, magnesium, calcium, or barium, and preferably made of calcium fluoride single crystal, which is high in plasma resistance. Consequently, it is possible to measure the intensity of light emitted from radicals of plasma at high sensitivity, and to reliably reduce particle contamination and metal contamination within the chamber 22. The other components of the processing units 2a and 2b shown in FIGS. 8 and 9 are the same as those of the processing unit 2 shown in FIG. 4. Accordingly, the same components are denoted by the same reference symbols, and the description thereof will be omitted.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

For example, according to the embodiments, the first plasma process or process using a corrosive gas is exemplified by a plasma etching process. However, this process is not limited to an etching process, and it may be another process using a corrosive gas, such as a halogen gas.

Further, according to the embodiments, the plasma etching apparatus is exemplified by an apparatus of the parallel-plate type. However, the apparatus is not limited to this type, and it may be an apparatus of the type that applies an RF power to only one of the upper electrode or lower electrode, or a plasma etching apparatus of the magnetron RIE type that employs permanent magnets. Furthermore, the apparatus is not limited to a plasma etching apparatus of the capacitive coupling type, and it may be another one of various plasma etching apparatuses, such as an apparatus of the inductive coupling type.

The method according to the present invention is applicable to a process using a corrosive gas, such as a process of manufacturing semiconductor devices.

What is claimed is:

1. A plasma processing method for performing a plasma process on a target object in a plasma processing apparatus,
the plasma processing apparatus comprising
a chamber configured to accommodate the target object,
a gas supply system configured to supply a process gas into the chamber,
an exhaust system configured to exhaust gas from inside the chamber,
an upper electrode and a lower electrode disposed to face each other in the chamber, the lower electrode being configured to support the target object,
a first RF (radio frequency) power supply configured to supply the upper electrode with a first RF power for generating plasma of a process gas inside the chamber, and
a second RF power supply configured to supply the lower electrode with a second RF power for providing the target object with a bias for attracting ions in plasma toward the target object,
the plasma processing method comprising:
consecutively performing a first plasma process, a second plasma process, and a third plasma process in this order in the chamber while keeping the target object placed in the chamber, such that
the first plasma process is arranged to supply both of the first RF power and the second RF power while supplying a first gas containing a halogen element selected from the group consisting of chlorine and bromine into the chamber, thereby generating first plasma from the first gas to perform an etching process on the target object while attracting ions in the first plasma toward the target object,
the second plasma process is arranged to supply the first RF power and not to supply the second RF power while supplying a second gas containing $O_2$ gas into the chamber, thereby generating second plasma containing $O_2$, plasma from the second gas and using the $O_2$ plasma to sputter and thereby remove a gas component including the halogen element and physically adsorbed on an inner wall of the chamber, a component inside the chamber, and the target object, and
the third plasma process is arranged to supply the first RF power and not to supply the second RF power while supplying a third gas containing fluorine into the chamber, thereby generating third plasma containing F radicals from the third gas and using the F radicals to etch and thereby remove a reaction product including the halogen element, generated by the first plasma process, and deposited on the target object,
wherein the first gas is a gas selected from the group consisting of hydrogen bromide gas, hydrogen chloride gas, chlorine gas, and a mixture gas thereof,
the second gas is a gas selected from the group consisting of $O_2$ gas and a mixture gas of $O_2$ gas with an inactive gas, and
the third gas is a fluorine-containing gas selected from the group consisting of $CF_4$ and a mixture of $CF_4$ and $O_2$.

2. The plasma processing method according to claim 1, wherein the third plasma process is arranged to remove a halogenated compound sticking to the target object.

3. The plasma processing method according to claim 1, wherein the third plasma process is arranged to remove a halogenated silicon sticking to the target object.

4. The plasma processing method according to claim 1, wherein the first plasma process is a plasma etching process performed on silicon present on the target object.

5. The plasma processing method according to claim 4, wherein the plasma etching process is a silicon trench etching process for providing shallow trench isolation.

6. The plasma processing method according to claim 1, wherein the first gas and the second gas are supplied via a same shower head.

7. The plasma processing method according to claim 6, wherein the first gas and the second gas pass into the shower head via a common valve.

8. The plasma processing method according to claim 1, wherein the chamber comprises a container that is conductive and grounded.

9. A plasma processing method for performing a plasma process on a target object in a plasma processing apparatus,
the plasma processing apparatus comprising
a chamber configured to accommodate the target object,
a gas supply system configured to supply a process gas into the chamber,
an exhaust system configured to exhaust gas from inside the chamber,
an upper electrode and a lower electrode disposed to face each other in the chamber, the lower electrode being configured to support the target object,
a first RF (radio frequency) power supply configured to supply the upper electrode with a first RF power for generating plasma of a process gas inside the chamber, and a second RF power supply configured to supply the lower electrode with a second RF power for providing the target object with a bias for attracting ions in plasma toward the target object, the plasma processing method comprising consecutively performing a first plasma process, a second plasma process, and a third plasma process in this order in the chamber while keeping the target object placed in the chamber, such that the first plasma process is arranged to supply both of the first RF power and the second RF power while supplying a halogen-containing gas containing a halogen element selected from the group consisting of chlorine and bromine into the chamber thereby generating halogen-containing plasma from the halogen-containing gas to perform an etching process on silicon present on the target object while attracting ions in the halogen-containing plasma toward the target object, the second plasma process is arranged to supply the first RF power and not to supply the second RF power while supplying $O_2$ gas into the chamber, thereby generating $O_2$ plasma from the $O_2$ gas and using the $O_2$ plasma to sputter and thereby remove a gas component including the halogen element and physically adsorbed on an inner wall of the chamber, a component inside the chamber, and the target object, and the third plasma process is arranged to supply the first RF power and not to supply the second RF power while supplying a fluorine-containing gas selected from the group consisting of $CF_4$ gas and a mixture gas of $CF_4$ and $O_2$ into the chamber, thereby generating fluorine-containing plasma containing F radicals from the fluorine-containing gas and using the F radicals to etch and thereby remove a halogenated silicon generated by the first plasma process and deposited on the target object.

10. The plasma processing method according to claim 9, wherein the etching process is a silicon trench etching process for providing shallow trench isolation.

11. The plasma processing method according to claim 9, wherein the chamber comprises a container that is conductive and grounded.

12. The plasma processing method according to claim 9, wherein the halogen-containing gas is a gas selected from the group consisting of hydrogen bromide gas, hydrogen chloride gas, chlorine gas, and a mixture gas thereof.

* * * * *